(12) United States Patent
Kurebayashi et al.

(10) Patent No.: US 9,301,385 B2
(45) Date of Patent: Mar. 29, 2016

(54) ELECTRONIC UNIT

(71) Applicant: KOITO MANUFACTURING CO., LTD., Minato-ku, Tokyo (JP)

(72) Inventors: Toshihiko Kurebayashi, Shizuoka (JP); Mikio Urushibata, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 213 days.

(21) Appl. No.: 14/053,858

(22) Filed: Oct. 15, 2013

(65) Prior Publication Data
US 2014/0112015 A1   Apr. 24, 2014

(30) Foreign Application Priority Data
Oct. 18, 2012   (JP) ................................. 2012-230495

(51) Int. Cl.
| | |
|---|---|
| H05K 7/20 | (2006.01) |
| H05K 1/02 | (2006.01) |
| H05K 5/00 | (2006.01) |
| F21V 29/507 | (2015.01) |

(52) U.S. Cl.
CPC ............ *H05K 1/0204* (2013.01); *F21V 29/507* (2015.01); *H05K 5/0047* (2013.01); *H05K 7/20472* (2013.01); *H05K 7/20854* (2013.01)

(58) Field of Classification Search
CPC . H05K 1/0206; H05K 1/0207; H05K 3/0061; H05K 1/0201; H05K 1/02; H05K 5/00; H05K 5/0026; H05K 5/0047; H05K 5/0073; H05K 7/20; B60Q 1/0088

USPC .................................. 362/547; 361/720, 752
See application file for complete search history.

(56) References Cited

U.S. PATENT DOCUMENTS

| | | | | |
|---|---|---|---|---|
| 6,377,462 | B1* | 4/2002 | Hajicek et al. ................. | 361/719 |
| 6,724,627 | B2* | 4/2004 | Onizuka et al. ............... | 361/704 |
| 6,740,545 | B2* | 5/2004 | King et al. ..................... | 438/118 |
| 6,972,959 | B2* | 12/2005 | Asai et al. ...................... | 361/719 |
| 8,220,878 | B2* | 7/2012 | Yoshinaga et al. ........ | 303/119.3 |
| 8,797,742 | B2* | 8/2014 | Kawai et al. ................... | 361/707 |
| 2008/0130224 | A1* | 6/2008 | Hashikura et al. ............ | 361/690 |
| 2008/0278918 | A1* | 11/2008 | Tominaga et al. ............. | 361/719 |
| 2009/0098749 | A1 | 4/2009 | Hashikura et al. | |
| 2011/0141706 | A1* | 6/2011 | Sasaki et al. .................. | 361/752 |

FOREIGN PATENT DOCUMENTS

| | | |
|---|---|---|
| CN | 101197496 A | 6/2008 |
| JP | 4087396 B2 | 5/2008 |
| JP | 2011-151133 A | 8/2011 |

OTHER PUBLICATIONS

Communication dated Sep. 28, 2015 from the State Intellectual Property Office of the People's Republic of China in counterpart Application No. 201310484937.6.

\* cited by examiner

*Primary Examiner* — Peggy Neils
(74) *Attorney, Agent, or Firm* — Sughrue Mion, PLLC

(57) ABSTRACT

An electronic unit includes an electronic body on which a heat generating component is mounted; a resin casing in which the electronic body is housed; and a heat diffusion sheet interposed between the casing and a region of the electronic body where the heat generating component is mounted.

6 Claims, 6 Drawing Sheets

ELECTRONIC UNIT

INCORPORATION BY REFERENCE

The disclosure of Japanese Patent Application No. 2012-230495 filed on Oct. 18, 2012 including the specification, drawings and abstract is incorporated herein by reference in its entirety.

BACKGROUND OF THE INVENTION

1. Field of the Invention

The invention relates to an electronic unit in which an electronic body is housed in a casing.

2. Description of Related Art

In a conventional vehicular lamp, such as a headlamp of a vehicle, for example, use of a discharge bulb as a light source has been proposed. Therefore, an electronic unit in which a circuit for controlling the lighting of this discharge lamp is house in a casing is formed, and this electronic unit is arranged in a lamp housing. Japanese Patent No. 4087396 proposes technology in which an electronic unit having such a structure is formed detachable with respect to the lamp housing. In recent years, many lamps using semiconductor light-emitting devices, such as an LED (Light Emitting Diode) for example, for the light source have been proposed. Therefore, an electronic unit has been proposed in which a LED drive circuit for making this LED emit light is formed housed, together with an electronic control unit (ECU) for controlling this light emission, in a single casing, and arranged in a lamp housing of the lamp.

With such an electronic unit, parts having high heat generation properties such as transistors and coils (hereinafter referred to as "heat generating parts") are used in a light emitting circuit for making the LED emit light, so the temperature of the electronic unit tends to rise from the heat generated by these heat generating parts. When the temperature rises in this way, it may adversely affect normal lighting control of the electronic unit, and various electronic components that form the electronic unit may become heat damaged. In particular, with a lamp having a structure in which the electronic unit is mounted to an external portion of the lamp housing, the casing must be formed as a sealed chamber in order to prevent outside dust from getting into the electronic unit. Therefore, heat generated inside the casing is not easily dissipated to the outside, so the electronic unit does not dissipate heat easily. In order to improve the heat dissipation effect, the casing is preferably made of material having high thermal conductivity, such as metal, for example, but this kind of material increases the weight as well as makes the manufacturing process of the casing complex, and thus increases the cost.

SUMMARY OF THE INVENTION

The invention thus provides an electronic unit that increases the heat dissipation effect, as well as reduces weight and cost.

An aspect of the invention relates to an electronic unit that includes an electronic body on which a heat generating component is mounted, a resin casing in which the electronic body is housed, and a heat diffusion sheet interposed between the casing and a region of the electronic body where the heat generating component is mounted.

According to the aspect of the invention, heat generated by the heat generating component of the electronic body is diffused in a planar direction of the heat diffusion sheet, by the heat diffusion sheet, and dissipated via the casing. Accordingly, the amount of heat per unit area of the surface of the casing is reduced, so the heat dissipation effect is able to be improved. As a result, even if the casing is made of resin, an electronic unit with high heat dissipation properties is able to be formed, and both weight and cost can be reduced.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
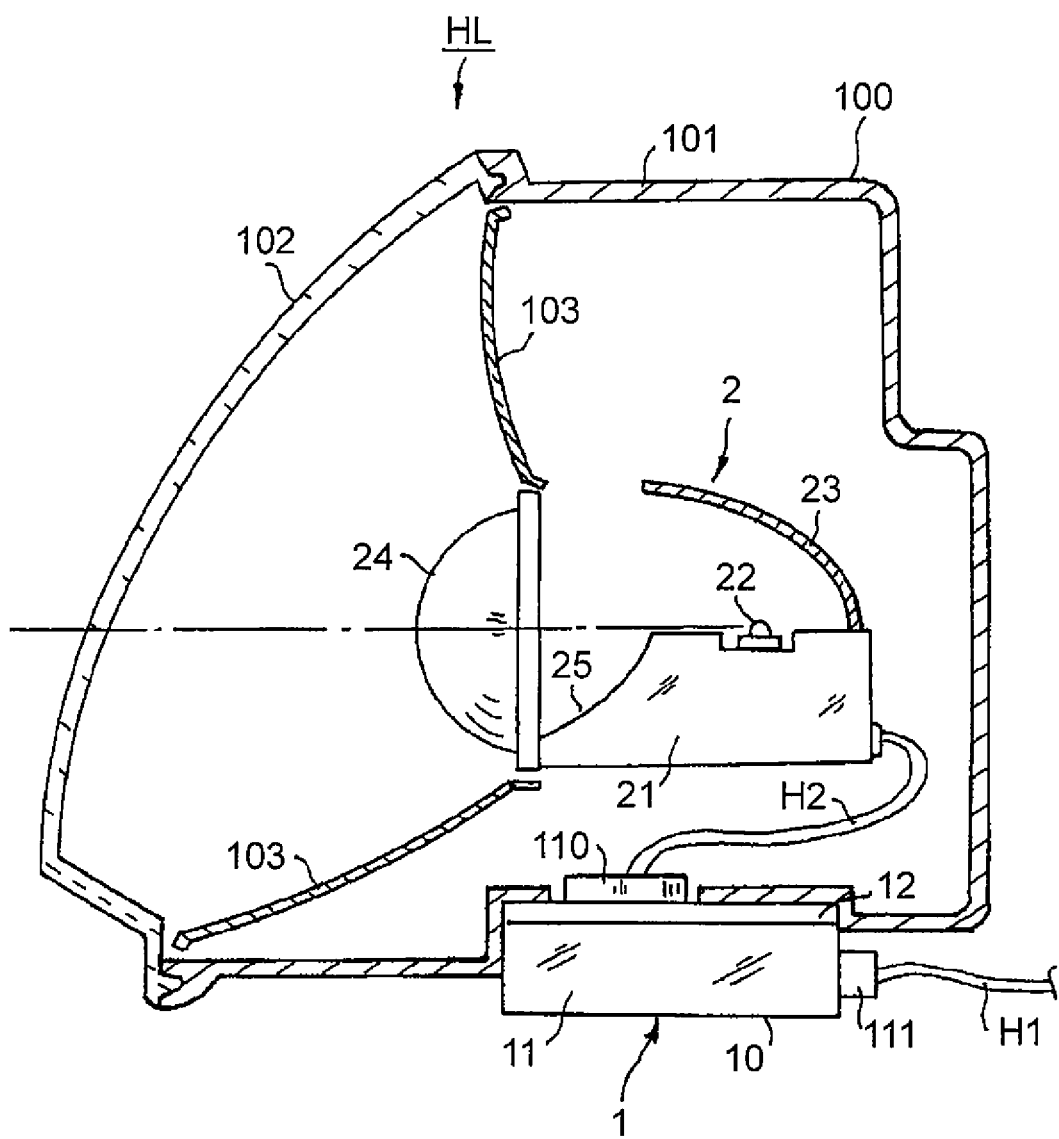
FIG. 1 is a sectional view schematically showing a first example embodiment in which the invention has been applied to a headlamp of a vehicle.

Example embodiments of the invention will now be described with reference to the accompanying drawings. FIG. 1 is a sectional view schematically showing a first example embodiment in which the electronic unit of the invention is used as an electronic unit that performs lighting control of a headlamp of a vehicle. A lamp housing 100 of a headlamp HL is formed by a lamp body 101 and a front cover 102. A light source unit 2 is arranged together with an extension (pseudo reflector) 103, inside the lamp housing 100. Also, an electronic unit 1 is provided on an external portion of the lamp housing 100, as a lighting control unit for lighting the light source of this light source unit 2, as well as for controlling the lighting state of the light source of this light source unit 2. This electronic unit 1 is mounted to an outer bottom surface of the lamp body 101 in this case.

The light source unit 2 is formed as a so-called projector-type lamp unit. That is, the light source unit 2 includes a unit base 21, a semiconductor light-emitting device, here an LED 22, as a light source mounted on the unit base 21, a reflector 23 arranged so as to cover this light source, and a projection lens 24 arranged in front of the LED 22. A portion of the unit base 21 forms a shade 25. When the LED 22 emits light, the light projected from the LED 22 is reflected by the reflector 23. This reflected light and direct light emitted by the LED 22 are radiated forward by the projection lens 24, with a portion of the reflected light and direct light being shielded or not shielded by the shade 25, such that light radiation of a required light distribution pattern is realized.

Figure 2:
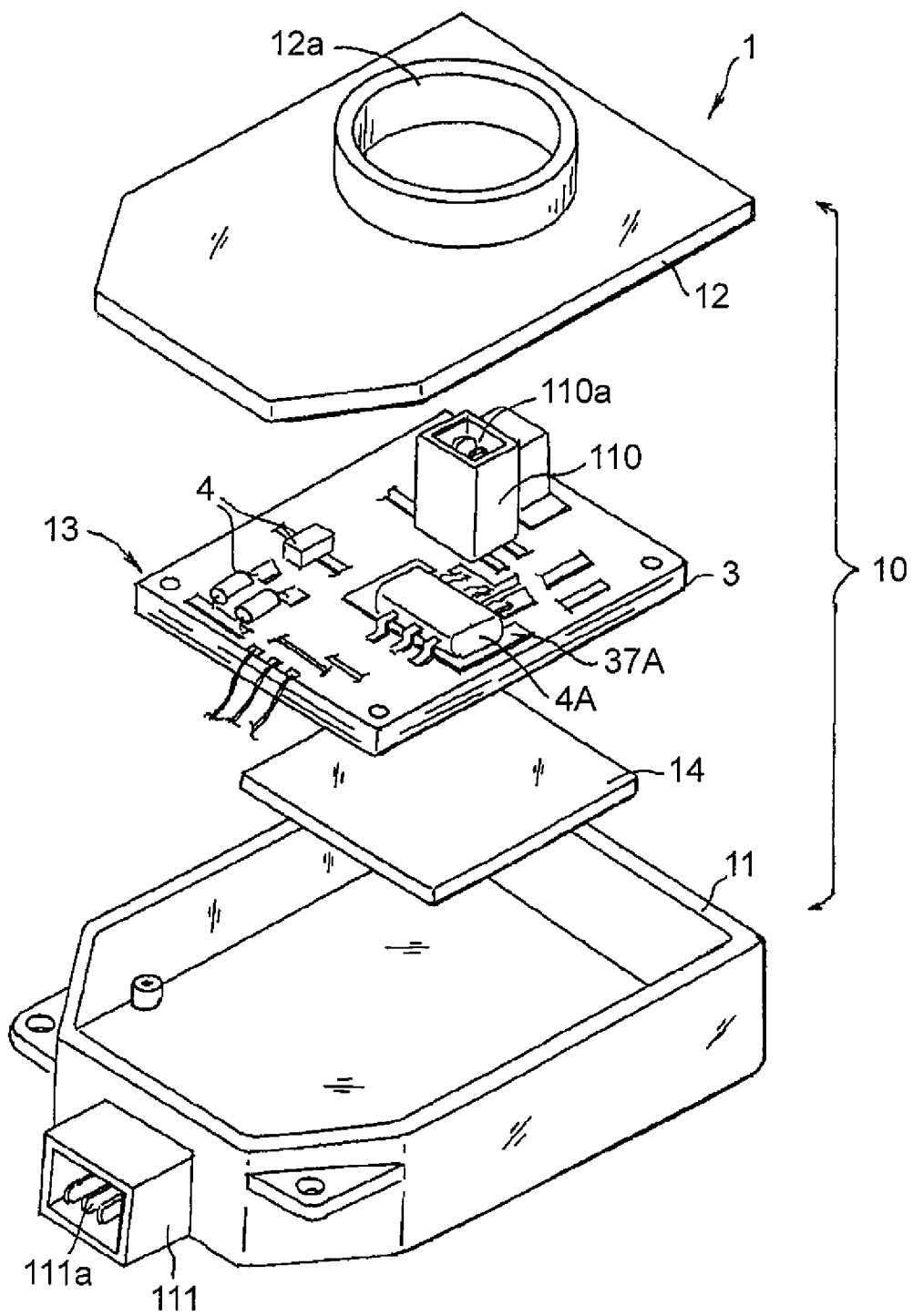
FIG. 2 is a partial exploded perspective view of an electronic unit according to the first example embodiment.

The electronic unit 1 is formed as a lamp ECU. This lamp ECU includes a LED drive circuit for supplying power to the LED 22 to light the LED 22. FIG. 2 is a partial exploded perspective view schematically showing this electronic unit 1. With this electronic unit 1, an electronic body 13 and a heat diffusion sheet 14 are housed inside of a sealed casing 10 that is made of resin. The sealed casing 10 includes a generally rectangular case main body 11 that has a small depth dimension and in which an upper portion is open (i.e., having an upper opening), and a plate cover 12 that attaches to the upper opening of this case main body 11. Here, a portion of the cover 12 is formed as a cylindrical portion 12a. This cylindrical portion 12a opens to the inside of the cover 12. An inside connector portion 110 that will be described later passes through this cylindrical portion 12a and is electrically connected to the light source unit 2 via a harness H2 (see FIG. 1). Also, an outside connector portion 111 is integrally formed on one side portion of the case main body 11, and is connected to a harness H1 (see FIG. 1) that is electrically connected to an external power supply such as an onboard battery or a main ECU for controlling the entire vehicle, neither of which is shown.

The casing 10, i.e., the case main body 11 and the cover 12, is made of resin so as to be lightweight. This casing 10 is made of polybutylene terephthalate (PBT) resin or polyphenylene sulfide (PPS) resin that contain glass dust to ensure the necessary mechanical strength. Here, the casing 10 is made of PBT resin. Also, the cover 12 is mounted in close contact with the outer bottom surface of the lamp housing 100, after being attached to the upper opening of the case main body 11. As a result, the inside of the casing 10 is communicated with the inside of the lamp housing 100, but is sealed off from the outside so that dust and moisture are inhibited from getting in from outside.

Figure 3:
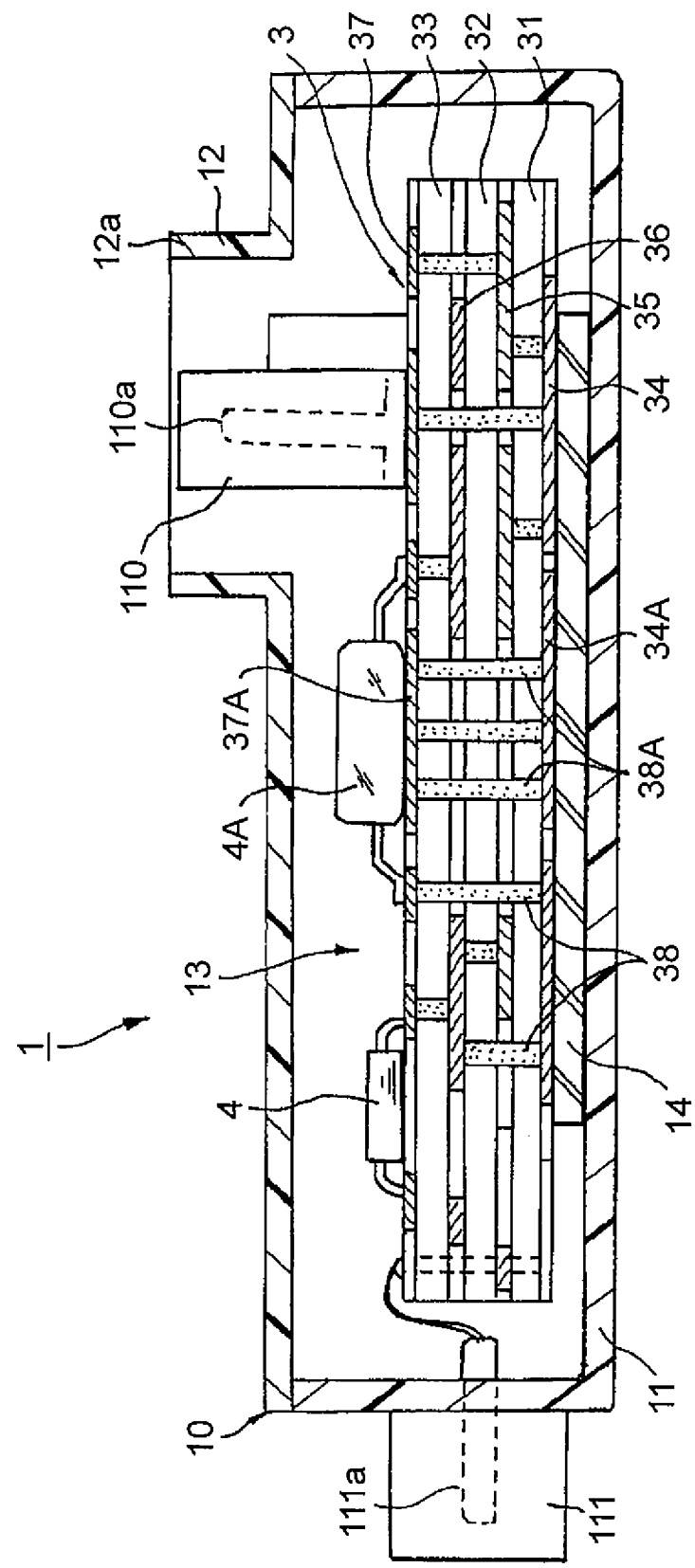
FIG. 3 is an enlarged longitudinal sectional view of a circuit board of the electronic unit in a thickness direction.

FIG. 3 is a longitudinal sectional view of the electronic unit 1. In the drawing, the dimensions in the thickness direction are shown enlarged to facilitate understanding of the structure of the electronic body 13 that is housed in the casing 10. As described above, the electronic body 13 is configured as a lamp ECU that includes a LED drive circuit for lighting the LED 22 of the light source unit 2. This electronic body 13 has a structure in which an electronic component 4 that forms the lamp ECU is mounted on a circuit board 3. The specific circuit structure of the lamp ECU has little relation to this application, so a detailed description thereof will be omitted here. The electronic component 4 that forms this lamp ECU includes heat generating components 4A such as a transistor and a coil. These heat generating components 4A generate heat when the electronic unit 1 is operating. Also, an inside connector portion 110 that has a contact 110a inside is mounted separate from the electronic component 4 on an upper surface of the circuit board 3. A connector, not shown, that passes through the cylindrical portion 12a of the cover 12 and is inserted from above is connected to the inside connector portion 110, such that an electrical connection with the light source unit 2 is established.

The circuit board 3 is configured as a printed circuit board having a four-layer wiring structure. In FIG. 3, the circuit board 3 has a first insulating layer 31, a second insulating layer 32, and a third insulating layer 33 that are stacked in three layers from bottom to top. First to fourth wiring layers 34, 35, 36, and 37 are formed from bottom to top on the upper and lower surfaces of these insulating layers 31 to 33. The first to fourth wiring layers 34, 35, 36, and 37 are wiring layers (wiring pattern layers) in which a conductive film is formed in a required pattern. The first wiring layer 34 and the fourth wiring layer 37 are formed as wiring pattern layers for forming the required lighting circuit and ECU circuit, and the electronic components 4 and 4A and the inside connector portion 110 are mounted on the surface of the fourth wiring layer 37 that is the top layer. The second wiring layer 35 and the third wiring layer 36 are formed here as a GND (ground) wiring layer and a VDD (power supply) wiring layer. Also, through-holes 38 for electrically connecting the first wiring layer 34 to the fourth wiring layer 37 together are formed in the thickness direction of the first insulating layer 31 to the third insulating layer 33. The required circuit is formed in the lamp ECU by these through-holes 38. Each of these through-holes 38 is formed by forming a conductive film on an inside surface of a through-hole formed through the insulating layers, or embedding conductive material inside the through-hole. These through-holes 38 electrically connect together upper and lower wiring layers that sandwich the insulating layers.

In the fourth wiring layer 37 that is the top layer, a heat transfer pad 37A is formed by a portion of the conductive film. Of the electronic components 4, heat generating components 4A that generate large amounts of heat such as a transistor and a coil are mounted on this heat transfer pad 37A, and the heat generated by these heat generating components 4A is transferred to this heat transfer pad 37A. This heat transfer pad 37A is formed on as large an area as possible, but not so large as to interfere with the wiring pattern of the fourth wiring layer 37. Also, in the first wiring layer 34 that is the bottom layer, a heat dissipating pad 34A is formed by a portion of the conductive film in a region that faces the heat transfer pad 37A in the vertical direction. This heat dissipating pad 34A is preferably formed as an island-shaped pattern that is electrically isolated from the wiring pattern of the first wiring layer 34. This heat dissipating pad 34A is also formed on as large an area as possible, but not so large as to interfere with the wiring pattern of the first wiring layer 34. Also, the heat transfer pad 37A and the heat dissipating pad 34A are connected in a conduction state by a plurality of through-holes 38A formed linearly through from the third to the first insulating layers 33 to 31. These through-holes 38A are preferably formed with a hole diameter that is as large as possible. The heat transfer pad 37A, the heat dissipating pad 34A, and the through-holes 38A serve as a heat transfer structure. This heat transfer structure, more specifically, the heat transfer pad 37A and the heat dissipating pad 34A, are not limited to a single location. When there is a plurality of heat generating components, a plurality of heat transfer structures are arranged in a plurality of locations corresponding to the heat generating components.

Also, the electronic body 13, i.e., the circuit board 3 on which the electronic component 4 is mounted, is housed inside the case main body 11. When housed, the heat diffusion sheet 14 is interposed between the lower surface of the circuit board 3, i.e., the lower surface of the first wiring layer 34, and the inside bottom surface of the case main body 11. This heat diffusion sheet 14 is formed by a thin plate of material having high thermal conductivity. For example, the heat diffusion sheet 14 is formed by a silicon or acrylic resin plate. Also, this heat diffusion sheet 14 absorbs the tolerance of the interval between the circuit board 3 and the case main body 11, and is formed of a thickness that enables it to closely contact both of these. In addition, the heat diffusion sheet 14 is formed having as large a planar dimension as possible with respect to the heat transfer structure provided on the circuit board 3. Preferably, the heat diffusion sheet 14 is formed having a dimension that covers almost the entire region of the circuit board 3. The heat diffusion sheet 14 maintains the insulating state with respect to the first wiring layer 34, with the upper surface of the heat diffusion sheet 14 closely contacting the heat dissipating pad 34A. For example, the heat diffusion sheet 14 is adhered to the heat dissipating pad 34A by an adhesive having high thermal conductivity.

When the heat diffusion sheet 14 is housed together with the electronic body 13 in the case main body 11, the lower surface of the heat diffusion sheet 14 is arranged in a state closely contacting the inside bottom surface of the case main body 11. Then the cover 12 is attached to the upper opening of the case main body 11, and fixed to the case main body 11 with screws or the like, thus forming the casing 10. The outside connector portion 111 of the casing 10 has a contact 111a. This contact 111a is electrically connected to the electronic body 13 by a lead wire when the electronic body 13 is housed in the casing 10.

The electronic unit 1 thus configured is mounted to the outside bottom surface of the lamp housing 100 of the headlamp HL, as shown in FIG. 1. Then the inside connector portion 110 is connected to the harness 112 that is connected to the light source unit 2, and the outside connector portion 111 is connected to the harness H1 that is connected to the main ECU and an external power supply, not shown. As a result, the electronic unit 1 is electrically connected to the light source unit 2, the external power supply, and the main ECU. Therefore, the electronic unit 1 controls the power supplied to the light source unit 2 based on a control signal output from the main ECU, thereby controlling the lighting state of the light source unit 2, in this case, the light-emitting timing and light-emitting luminosity of the LED 22.

Figure 4:
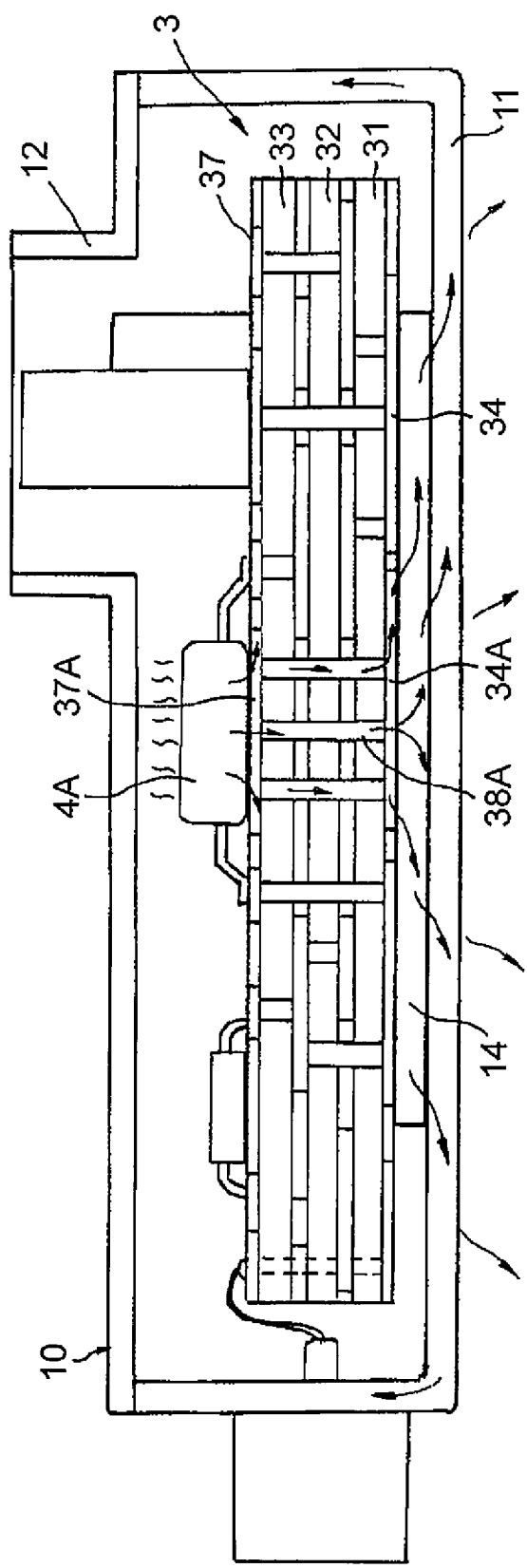
FIG. 4 is a sectional view showing a frame format similar to FIG. 3, for illustrating a heat dissipation path.

During operation of this lighting control of the electronic unit 1, the heat generating component 4A in the electronic unit 1 generates heat. At this time, as shown in the frame format in FIG. 4, heat generated in the heat generating component 4A is transferred to the heat transfer pad 37A on which the heat generating component 4A is mounted, and from here, the heat is transferred to the heat dissipating pad 34A on the lower surface side of the circuit board 3 via the through-holes 38A. The heat transfer pad 37A and the heat dissipating pad 34A each have as large an area as possible, so the heat transferred to these pads is diffused across the entire region of the pads. Then, the heat that has been transferred to the heat dissipating pad 34A is transferred to the heat diffusion sheet 14 that is in close contact with the heat dissipating pad 34A, and after being diffused to the entire region of this heat diffusion sheet 14, the heat is then transferred from the inside bottom surface of the case main body 11 that is in close contact with the heat diffusion sheet 14, to the case main body 11. As a result, the heat generated by the heat generating component 4A is diffused by the heat transfer pad 37A and the heat dissipating pad 34A, and further diffused to a wider area by the heat diffusion sheet 14. Then the heat is transferred to the bottom surface of the case main body 11, or to the entire case main body 11. One portion of this heat is then dissipated to the outside air from the outer surface of the case main body 11. Also, another portion of the heat is transferred on from the case main body 11 to the lamp housing 100, and then dissipated from here.

In this way, the heat generated by the heat generating component 4A is transferred in the thickness direction of the circuit board 3, and ultimately the amount of heat per unit area is reduced by the heat diffusion sheet 14 and the heat is transferred to the case main body 11 where it is dissipated, so an extremely high heat dissipation effect is able to be obtained. Therefore, an electronic unit 1 capable of inhibiting a temperature increase due to heat generated by the electronic body 13, and thus performing stable lighting control, even if the casing 10 is made of resin, is able to be achieved. Further, because the casing 10 is made of resin, the cost and weight are able to be reduced compared with a metal casing.

Figure 5:
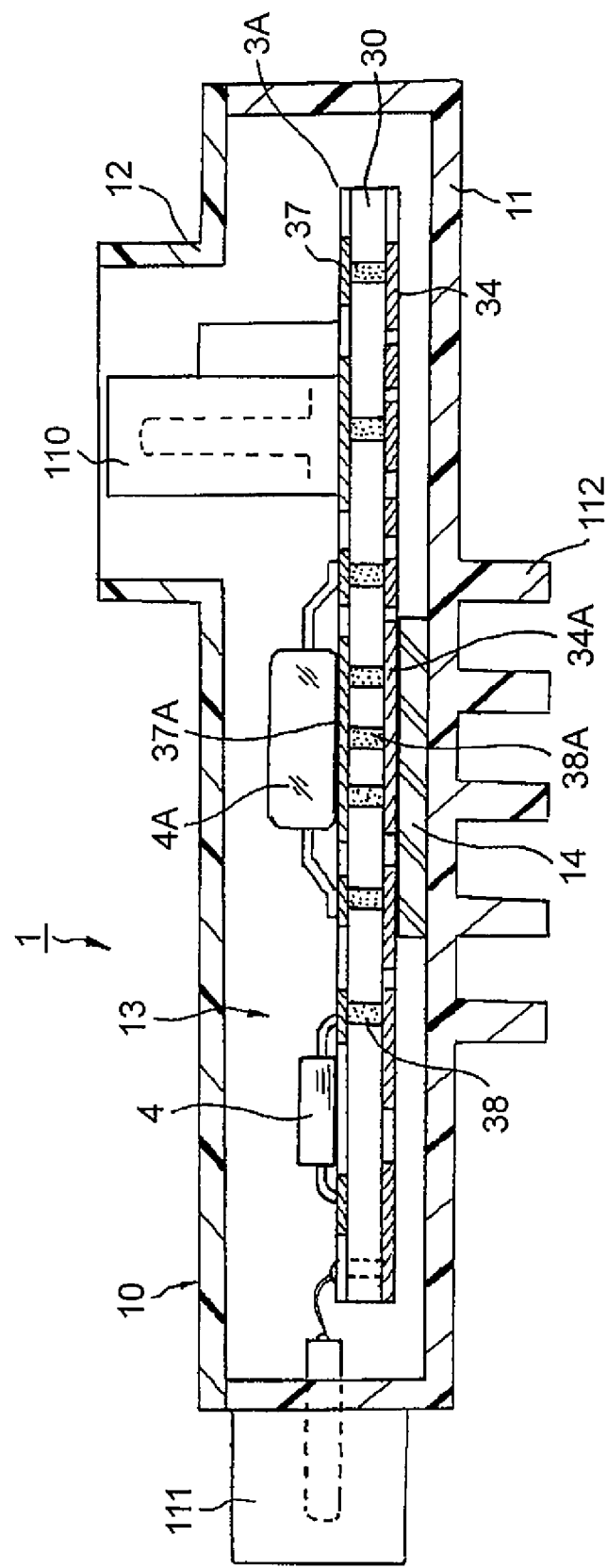
FIG. 5 is a longitudinal sectional view similar to FIG. 3, of a second example embodiment of the invention.

In the first example embodiment, the circuit board 3 of the electronic body 13 is formed by a four-layer circuit board, but the invention may also be applied with a circuit board having a two-layer structure or another structure. FIG. 5 is a sectional view of a circuit board 3A having a two-layer structure according to a second example embodiment of the invention. Portions equivalent to portions in FIG. 3 will be denoted by like reference characters. Here, a lower wiring layer 34 is formed on a lower surface of a single insulating layer 30, and an upper wiring layer 37 is formed on an upper surface of the single insulating layer 30. These upper and lower wiring layers 34 and 37 are each formed in a predetermined wiring pattern, with a heat transfer pad 37A formed at a portion of the upper wiring layer 37 and a heat dissipating pad 34A formed at a portion of the lower wiring layer 34, in the region where the heat generating component 4A is mounted. Then, a heat transfer structure is formed by electrically connecting the heat transfer pad 37A and the heat dissipating pad 34A together by through-holes 38A provided in the insulating layer 30. Also, a heat diffusion sheet 14 is arranged in close contact with the heat dissipating pad 34A on the lower side. This heat diffusion sheet 14 is configured so as to closely contact the inside bottom surface of the case main body 11 when the circuit board 3A is housed in the casing 10.

In this way, even if the circuit board 3A having a two-layer wiring structure is used, the heat generated by the heat generating component 4A is transferred to the heat diffusion sheet 14 via the heat transfer structure. That is, the heat generated by the heat generating component 4A is transferred from the heat transfer pad 37A to the heat dissipating pad 34A via the through-holes 38A, and then transferred from here to the heat diffusion sheet 14. Moreover, after the heat is transferred to the case main body 11, it is then dissipated from the casing 10. That is, the heat generated by the heat generating component 4A is diffused in a planar direction at both the heat transfer pad 37A and the heat dissipating pad 34A, and then further diffused in the planar direction by the heat diffusion sheet 14, so the amount of heat per unit area is able to be reduced, which enables the heat dissipation effect to be increased.

In this second example embodiment, the circuit board 3A is a two-layer structure, so when forming a wiring pattern required to form the lamp ECU, there is a limit as to how much the areas of the heat transfer pad 37A and the heat dissipating pad 34A can be increased. Also, there is also a limit as to how much the area of the heat diffusion sheet 14 can be increased. Therefore, compared to the first example embodiment shown in FIG. 3, the heat diffusion of the heat transfer pad 37A and the heat dissipating pad 34A may be less, and the heat diffusion effect of the heat diffusion sheet 14 may also be less. Therefore, in this case, in order to further improve the heat dissipation effect of the casing 10, heat dissipating fins 112 are formed by a plurality of ribs with rectangular cross sections that stand upright in a region of the outside bottom surface of the case main body 11, or more particularly, in a region facing the heat diffusion sheet 14. Forming such heat dissipating fins 112 increases the surface area of the outer surface of the case main body 11, thereby enabling heat transferred to the case main body 11 via the heat diffusion sheet 14 to be even more effectively dissipated. These heat dissipating fins 112 are not limited to being rib-shaped as long as they increase the surface area of the case main body 11. That is, the heat dissipating fins 112 may be designed in any of a variety of shapes. Also, the heat dissipating fins 112 may be formed on the entire surface of the case main body 11, and may also be formed on the cover 12.

Figure 6:
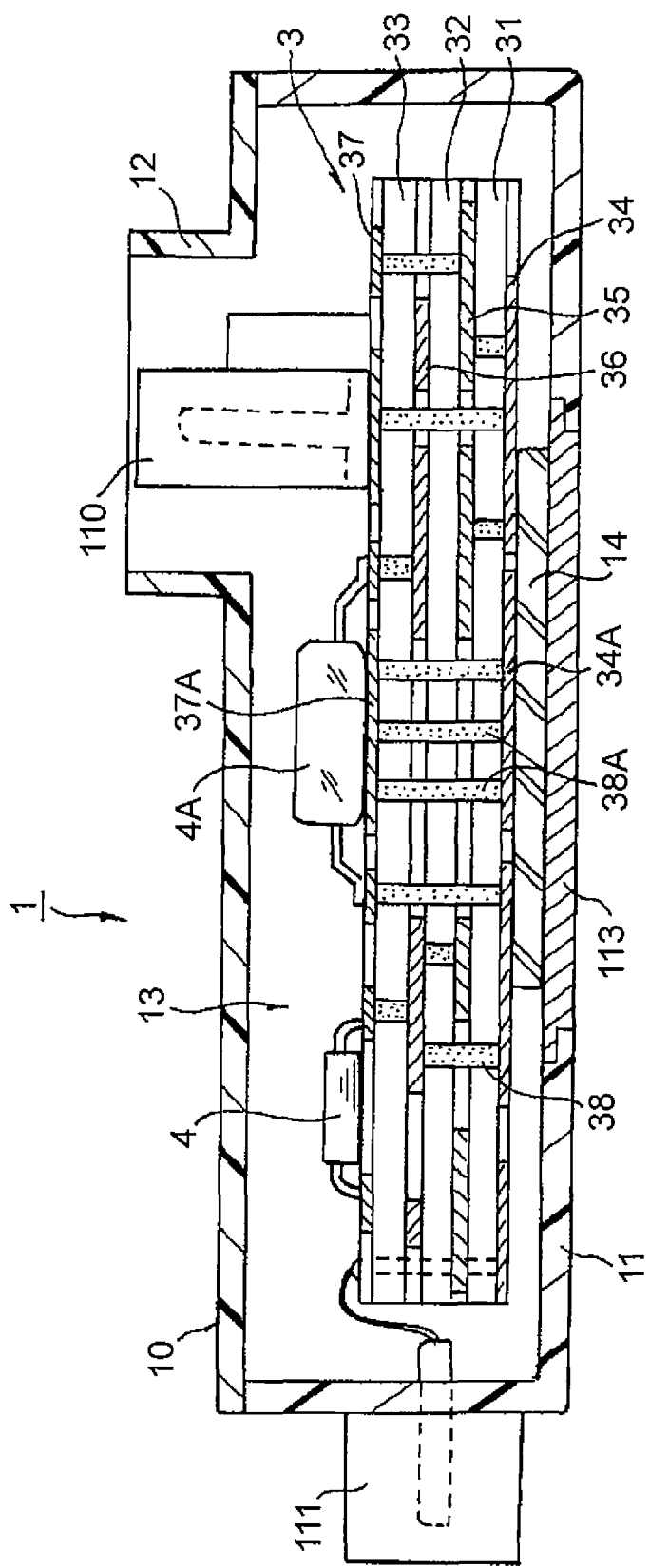
FIG. 6 is a longitudinal sectional view similar to FIG. 3, of a third example embodiment of the invention.

Also, in the electronic unit of the invention, the entire case main body 11 does not have to be made of resin. That is, as illustrated in a third example embodiment shown in FIG. 6, a portion of the case main body 11, more particularly, a region of the bottom surface facing the heat diffusion sheet 14, may be made of material with higher thermal conductivity than another region, preferably metal. For example, the case main body 11 is formed by integrally forming a metal plate with resin. At this time, the case main body 11 need simply be resin molded such that the metal plate is exposed to at least the region of the bottom surface facing the heat diffusion sheet 14. In this case, a copper plate is used as the metal plate 113. Accordingly, the heat transferred to the heat diffusion sheet 14 is able to be more effectively dissipated outside by this metal plate 113. Even if a portion of the case main body 11 is formed by the metal plate, the increase in weight and cost is only slight compared to what it is when the entire casing is made of metal.

In the example embodiments, an example is described in which the electronic unit is formed as a lamp ECU for controlling the lighting of a headlamp of a vehicle in which an LED is used as the light source, but the electronic unit may also be used to control the lighting of a lamp other than a headlamp. Alternatively, the electronic unit may also be used for swivel controlling or leveling a headlamp. That is, the invention may be applied to any electronic unit as long as it is an electronic unit in which an electronic body on which a heat generating component is mounted is housed inside of a casing.

In the example embodiments, resin that includes glass powder or particles is used for the case main body and the cover that form the casing, which is effective for increasing the mechanical strength of the case main body and the cover. However, the case main body and the cover may also be made of resin that does not include a glass component.

The invention may be employed with an electronic unit having a structure in which a circuit for controlling the lighting of a light source of a vehicular lamp, and other circuits, are housed inside of a casing.

As described above, an aspect of the invention relates to an electronic unit that includes an electronic body on which a heat generating component is mounted, a resin casing in which the electronic body is housed, and a heat diffusion sheet interposed between the casing and a region of the electronic body where the heat generating component is mounted.

The electronic body may also include a circuit board in which the heat generating component is mounted on a first surface. The circuit board may include a heat transfer structure for transferring heat generated by the heat generating component toward a second surface that is on an opposite side of the circuit board from the first surface. The heat diffusion sheet may be arranged between the second surface of the circuit board and an inside surface of the casing, in a state closely contacting the second surface of the circuit board and the inside surface of the casing. The heat diffusion sheet may be arranged extending over at least a region of the circuit board where the heat transfer structure is formed. Also, the heat diffusion sheet may be arranged extending over substantially an entire surface of the circuit board.

The heat transfer structure may be formed by a heat transfer pad that is formed by a portion of a conductive film on the first surface of the circuit board, and on which the heat generating component is mounted; a heat dissipating pad that is formed by a portion of a conductive film on the second surface of the circuit board; and a through-hole that passes through the circuit board in a thickness direction of the circuit board, for electrically connecting the heat transfer pad and the heat dissipating pad together.

The electronic unit may be configured as a lighting control device of a vehicular lamp, and the casing may be attached to a lamp housing of the lamp. The electronic unit may also include a heat dissipating fin formed in a region of an outside bottom surface of the casing, which faces the heat diffusion sheet. One region of a bottom surface of the casing, which faces the heat diffusion sheet may be made of material having higher thermal conductivity than material that forms another region.

According to the configurations described above, the heat transfer pad, the heat dissipation pad, and the through-hole are formed on a circuit board in which electronic components including heat generating components are mounted to a front surface (the first surface). As a result, heat generated by a heat generating component is transferred to the back surface (the second surface) of the circuit board, and further, is able to be dissipated after having been diffused to a wider area by the heat diffusion sheet, which enables the heat dissipation effect to be improved.

What is claimed is:

1. An electronic unit comprising:
    an electronic body on which a heat generating component is mounted;
    a resin casing in which the electronic body is housed; and
    a heat diffusion sheet interposed between the casing and a region of the electronic body where the heat generating component is mounted;
    wherein:
    the electronic body includes a circuit board in which the heat generating component is mounted on a first surface;
    the circuit board includes a heat transfer structure for transferring heat generated by the heat generating component toward a second surface that is on an opposite side of the circuit board from the first surface;
    the heat diffusion sheet is arranged between the second surface of the circuit board and an inside surface of the casing, in a state closely contacting the second surface of the circuit board and the inside surface of the casing; and
    the heat transfer structure is formed by a heat transfer pad that is formed by a portion of a conductive film on the first surface of the circuit board, and on which the heat generating component is mounted; a heat dissipating pad that is formed by a portion of a conductive film on the second surface of the circuit board; and a through-hole that passes through the circuit board in a thickness direction of the circuit board, for electrically connecting the heat transfer pad and the heat dissipating pad together.

2. The electronic unit according to claim 1, wherein the heat diffusion sheet is arranged extending over at least a region of the circuit board where the heat transfer structure is formed.

3. The electronic unit according to claim 1, wherein the heat diffusion sheet is arranged extending over substantially an entire surface of the circuit board.

4. The electronic unit according to claim 1, wherein:
    the electronic unit is configured as a lighting control device of a vehicular lamp; and
    the casing is attached to a lamp housing of the lamp.

5. The electronic unit according to claim 1, further comprising a heat dissipating fin formed in a region of an outside bottom surface of the casing, which faces the heat diffusion sheet.

6. The electronic unit according to claim 1, wherein one region of a bottom surface of the casing, which faces the heat diffusion sheet, is made of material having higher thermal conductivity than material that forms another region.

* * * * *